US006670036B2

(12) United States Patent
Iino et al.

(10) Patent No.: US 6,670,036 B2
(45) Date of Patent: Dec. 30, 2003

(54) SILICON SEED CRYSTAL AND METHOD FOR PRODUCING SILICON SINGLE CRYSTAL

(75) Inventors: Eiichi Iino, Gunma-ken (JP); Masanori Kimura, Gunma-ken (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/287,199

(22) Filed: Apr. 6, 1999

(65) Prior Publication Data

US 2002/0098358 A1 Jul. 25, 2002

(30) Foreign Application Priority Data

Apr. 7, 1998 (JP) .......................... 10-111410
Apr. 15, 1998 (JP) .......................... 10-122859

(51) Int. Cl.[7] .................................. B32B 5/16
(52) U.S. Cl. .................. 428/402; 424/364; 424/387; 423/348; 423/349; 423/350; 117/20; 117/902; 117/911; 117/916; 23/301
(58) Field of Search .............. 424/364, 397; 117/20, 902, 911, 916; 23/301; 423/348, 349, 350, 402

(56) References Cited

U.S. PATENT DOCUMENTS

| 5,423,283 A | * | 6/1995 | Seki .......................... 117/19 |
| 5,911,822 A | * | 6/1999 | Abe et al. .................. 117/13 |
| 6,080,237 A | * | 6/2000 | Iwasaki et al. ............. 117/13 |

FOREIGN PATENT DOCUMENTS

| DE | 197-37-581 A1 | 3/1999 |
| JP | 47-3243 | 1/1972 |
| JP | 59-131596 | 7/1984 |
| JP | 60-374 | 1/1985 |
| JP | 04-042894 | 2/1992 |
| JP | 04-104988 | 4/1992 |
| JP | 5-139880 A | 6/1993 |
| JP | 07-206583 | 8/1995 |
| JP | 09-235186 | 9/1997 |
| JP | 09-235486 | 9/1997 |
| JP | 09-249486 | 9/1997 |
| JP | 09-249492 | 9/1997 |
| JP | 09-249495 | 9/1997 |
| JP | 09249495 | 9/1997 |
| JP | 09255485 A | 9/1997 |
| JP | 10203898 A | 8/1998 |

OTHER PUBLICATIONS

Chu, P.K. "Direct Comparison of FTIR and SIMS calibrations for (O) in Silicon," XP–002117243, Mater. Res. Soc., USA, 1986, p 67–71.

* cited by examiner

Primary Examiner—Leszek Kiliman
(74) Attorney, Agent, or Firm—Hogan & Hartson, L.L.P.

(57) ABSTRACT

There are disclosed a silicon seed crystal which is composed of silicon single crystal and used for the Czochralski method, wherein oxygen concentration in the seed crystal is 15 ppma (JEIDA) or less, a silicon seed crystal which is used for the Czochralski method, wherein the silicon seed crystal does not have a straight body, and a method for producing a silicon single crystal by the Czochralski method comprising using said seed crystal, bringing a tip end of the seed crystal into contact with a silicon melt to melt the tip end of the seed crystal, with or without performing necking operation, and growing a silicon single crystal.

The method is capable of improving the rate of success in making crystals dislocation-free and the productivity of single crystal rods regardless of the use of necking operation.

6 Claims, 3 Drawing Sheets

(a)

(b)

(c)

(a)

(b)

(a) (b)

(a) (b)

SILICON SEED CRYSTAL AND METHOD FOR PRODUCING SILICON SINGLE CRYSTAL

BACKGROUND OF THE INVENTION

1. Field of the Invention

The present invention related to a method for producing a silicon single crystal, wherein the silicon single crystal is grown by the Czochralski method (CZ method) with or without performing necking operation, and a silicon seed crystal.

2. Related Art

In the conventional production of silicon single crystals according to the CZ method, a silicon single crystal is used as a seed crystal, which is brought into contact with silicon melt and then slowly pulled while being rotated to grow a single crystal ingot. In such a method, after the seed crystal is brought into contact with the silicon melt, the so-called necking is performed to form a neck portion having a smaller diameter of around 3 mm to eliminate dislocation propagated from slip dislocations generated in the seed crystal in high density due to thermal shock, then the diameter of the crystal is increased to a predetermined diameter, and a dislocation-free silicon single crystal is pulled. The necking operation performed as described above is widely known as the Dash Necking method, and has commonly been used for pulling a silicon single crystal ingot by the CZ method.

That is, conventionally used seed crystals have, for example, a cylindrical or prismatic shape with a diameter or side length of about 8–20 mm, and have a cut-away portion or a notch for attaching the seed crystal to a seed holder, and a flat bottom surface in a tip end thereof, which is initially brought into contact with the silicon melt. In order to safely pull a single crystal ingot while withstanding the weight of heavy single crystal ingot, it is difficult to use a thickness of the seed crystal smaller than the range mentioned above, considering the strength of the material.

Because a seed crystal having such a shape as described above has a large heat capacity of the tip end which is brought into contact with the melt, a large temperature difference is suddenly generated in the crystal upon the contact with the melt, and thus slip dislocations are generated at a high density. Accordingly, the aforementioned necking operation becomes necessary in order to eliminate these dislocations to grow a single crystal.

However, under the circumstance described above, the necking operation must be performed to a minimum diameter of 3–5 mm in order to completely eliminate the dislocations even if the other necking conditions are selected variously. The mechanical strength obtained by such a diameter has become insufficient for supporting a single crystal ingot getting heavier with recent use of a larger diameter of the silicon single crystals, and thus a serious accident threatens to occur, for example, the single crystal ingot falls due to breakage of the neck portion of a small diameter.

To solve these problems, the applicants of this application have previously suggested such invention as disclosed in Japanese Patent Laid-Open Publication No. 5-139880, and Japanese Patent Application No. 8-87187 (Japanese Patent Laid-Open Publication No. 9-255485). These inventions relate to techniques employing a seed crystal whose tip end has wedge shape or a hollow to reduce as far as possible the slip dislocations generated upon the contact of the seed crystal with the silicon melt, and thereby allowing dislocation-free production even when a relatively large diameter of the neck portion is used to improve the mechanical strength.

Though these methods are expected to improve the mechanical strength of the neck portion to some extent because of the use of a large diameter of the neck portion, they still perform the necking operation as ever, and hence form a necking portion containing slip dislocations. For the pulling of recent single crystals whose length and diameter are increasingly getting longer and larger, for example, which have a weight of 150 kg or more, the mechanical strength of the neck portion obtained even in these methods may become insufficient, and therefore they cannot be considered ultimate solutions.

Therefore, the applicants of the present application previously developed a method for converting crystals into single crystals without forming a neck portion, which is the most problematic factor as for ensuring the mechanical strength, and filed a patent application therefor (Japanese Patent Application No. 9-17687). This method uses a seed crystal having a tip end in a sharp-pointed shape or truncated sharp-pointed shape, which tip end is brought into contact with the silicon melt as the seed crystal. First, the tip end of the seed crystal is carefully brought into contact with the silicon melt, the seed crystal was let down at a low rate to melt the tip end of the seed crystal until it gets a desired diameter, and then the seed crystal is slowly pulled upwardly to grow a silicon single crystal ingot of a desired diameter without performing necking operation.

According to this method, because the contact area when the tip end of the seed crystal is initially brought into contact with the silicon melt and heat capacity of the tip end are small, thermal shock or steep temperature gradient does not occur in the seed crystal, and hence the dislocations are not introduced. Then, by letting down the seed crystal at a low rate to melt it down until the tip end of the seed crystal gets a desired diameter, steep temperature gradient is prevented, and the slip dislocations are not introduced into the seed crystal also during the melting down process. Finally, a silicon single crystal ingot can be grown to a desired diameter by slowly pulling the seed crystal as it is with no need to perform the necking, because the seed crystal has the desired diameter, no dislocation, and sufficient strength.

As described above, while temperature holding or heating of seed crystals above the melt, shapes or methods for reducing thermal shock upon seeding and the like have been suggested as means for lowering the initial dislocation density for the conventional necking seeding method, the diameter of the neck portion, which has a certain upper limit, has become to be unable to follow the production of larger and heavier single crystal ingots. In addition, such conditions do not necessarily afford a high rate of success in making crystals dislocation-free.

Therefore, the dislocation-free seeding method without performing the necking operation, which can cope with the use of such a larger diameter and heavier weight as mentioned above, has been established.

However, it is the rate of success in making crystals dislocation-free that may be a difficulty in the dislocation-free seeding method. That is, according to this method, if dislocations are once introduced, the operation cannot be reattempted unless the seed crystal is changed. Therefore, it is particularly important to improve the rate of success in making crystals dislocation-free. In addition, even though the seeding is performed in a dislocation-free state in this method, slip dislocations may be generated when the seed crystal is left at a temperature around the melting point of silicon for a certain period of time after a predetermined length of the tapered tip end of the seed crystal is melted, or depending on the period requiring for starting the crystal growth, and such dislocations may further increase. Investigations of the cause of this phenomenon revealed that the control of the factors which had conventionally been controlled, for example, shape of the seed crystal, temperature holding time above the melt surface, melting down rate, single crystal growing rate and the like, is not sufficient for eliminating the phenomenon, and such control could not afford so high rate of success in making crystals dislocation-free and sufficient reproducibility.

Further, as shown in FIG. 6(b), a conventional seed crystal holder have a structure where a straight body 2 of a seed crystal 1 is inserted into a cylindrical member of the seed crystal holder body, and the seed crystal is fixed with a taper pin 16 inserted from the side face of the cylindrical member into a notch 15 of the seed crystal straight body 2. However, the contact area between the notch 15 and the taper pin 16 is small in this structure, and therefore stress is concentrated thereon, thereby increasing the possibility of breakage.

Moreover, because the seed crystal 1 having sharp-pointed tip end used for the dislocation-free seeding method without performing the necking operation, for example, one shown in FIG. 6(a), has a straight body 2 for providing the notch 15, the straight body provides additional heat capacity. Further, the straight body present in the seed crystal holder provides additional volume, and hence the volume of the seed crystal holder itself, i.e., its heat capacity becomes larger. This not only lowers the rate of temperature increase when the seed crystal is approached to the melt surface, but also makes the temperature gradient during the melting down of the seed crystal into the melt or the pulling operation larger, and therefore it provides a condition that dislocations are likely to occur, and generated dislocations are difficult to be eliminated.

SUMMARY OF THE INVENTION

The present invention has been completed to solve the aforementioned problems of the prior art, and its object is to provide a seed crystal which is hardly introduced with dislocations during the process of the CZ method, aiming at improving the rate of success in making crystals dislocation-free in the dislocation-free seeding method with or without performing necking operation using the seed crystal, thereby providing a method for producing a silicon single crystal capable of improving productivity of single crystal ingots having large diameter and heavy weight.

To solve the aforementioned problems, the present invention provides a silicon seed crystal which is composed of silicon single crystal and used for the Czochralski method, wherein oxygen concentration in the seed crystal is 15 ppma (JEIDA) or less.

When a silicon seed crystal having an oxygen concentration in the seed crystal of 15 ppma (JEIDA) or less as defined above is used, oxygen does not precipitate during, for example, contact with the melt and melting down therein of the seed crystal, and substantially no slip dislocation containing precipitated oxygen as a nucleus is generated. Therefore, the rate of success in making crystals dislocation-free is improved regardless of the use of necking, and thereby productivity and production yield of dislocation-free silicon single crystals are improved.

The aforementioned silicon seed crystal preferably has a shape having a sharp-pointed tip end, or a truncated sharp-pointed tip end.

Because a seed crystal having such a shape would have an extremely small heat capacity of its tip end, thermal shock is attenuated when the seed crystal is brought into contact with the melt, and hence generation of slip dislocations is reduced. In addition, it synergistically further improves the rate of success in making crystals dislocation-free together with the suppressed oxygen concentration.

The present invention also provides a silicon seed crystal which is used for the Czochralski method, wherein the silicon seed crystal does not have a straight body.

Because such a seed crystal which does not have a straight body is substantially composed only of a portion serving as a seed crystal, the volume of the seed crystal as a whole is remarkably decreased, and thus unnecessary heat capacity is also decreased. As a result, the total heat capacity of the seed crystal and the seed crystal holder also becomes small, and the rate of temperature increase is increased when the seed crystal is approached to the melt surface. Moreover, the temperature gradient can be made smaller during its melting down and pulling after the tip end of the seed crystal is brought into contact with the melt. Therefore, dislocations becomes less likely to be generated, and already generated dislocations become likely to disappear. Furthermore, improvement of the rate of temperature increase may shorten the operation time, and hence is expected to improve the productivity and the production yield.

The aforementioned seed crystal preferably has a body shape selected from the group consisting of shapes of cone, pyramid, truncated cone, truncated pyramid, combination of cone and truncated cone, combination of cone and truncated pyramid, combination of pyramid and truncated pyramid, and combination of pyramid and truncated cone.

As the seed crystal which does not have a straight body, various shapes can be exemplified as mentioned above. As for the advantageous effects thereof, for example, a seed crystal having a cone shape is held by a crystal seed holder on a part of its side surface near its bottom face, or all of its side surface, and therefore the load withstanding property of the seed crystal itself may be improved. Further, the absence of the straight body reduces the total volume and heat capacity of the seed crystal and the seed crystal holder, and accelerates the rate of temperature increase when the seed crystal is approached to the melt surface. Moreover, the temperature gradient can be made smaller during its melting down and pulling after the tip end of the seed crystal is brought into contact with the melt. Therefore, dislocations become less likely to be generated, and already generated dislocations become likely to disappear. It is clear that a seed crystal having one of the shapes mentioned above other than the cone shape can exert substantially the same advantageous effects as those provided by the cone shape.

A part or all of side surface of the aforementioned seed crystal is preferably formed with curved surface.

For example, when a seed crystal which has a tapered cone shape tip end having a straight ridgeline is melted down into a silicon melt from the tip end at a constant rate, the melting interface diameter of the seed crystal becomes larger in proportion to the lapsed time. On the other hand, by using a silicon seed crystal a part or all of which side surface is formed with curved surface, increase rate of the diameter along the ridgeline can be made smaller compared with that provided by the straight ridgeline in the region of the cone whose side surface is formed with curved surface, and therefore the thermal stress in a portion where the diameter of the melting interface is getting larger is greatly attenuated. Accordingly, the probability of slip dislocation generation is reduced, and the region where dislocations are more likely to be generated is shifted to the thicker side. The pulling can be started from a point in a dislocation-free state defined after such a regional shift. This improves the rate of success in making crystals dislocation-free, and can sufficiently meet the requirements for growing single crystals having a larger diameter and heavier weight.

The aforementioned seed crystal which does not have a straight body of the present invention preferably has an oxygen concentration in the seed crystal of 16 ppma (JEIDA) or less.

By using such a low oxygen concentration in the seed crystal, oxygen does not precipitate during the contact and the melting down of the seed crystal not having a straight body in the melt, and substantially no slip dislocation containing precipitated oxygen as a nucleus is generated. These effects is realized by the fact that the shape of the aforementioned seed crystal reduces the total heat capacity of the seed crystal and the seed crystal holder, and hence the seed crystal is maintained at a high temperature of the melt to a certain height from the liquidus-solidus interface, which makes the precipitation of oxygen difficult. As for a seed crystal not having a straight body, the advantage can be more effectively exhibited when the initial oxygen concentration in the seed crystal is 16 ppma or less.

The present invention also provides a method for producing a silicon single crystal by the Czochralski method comprising bringing a tip end of a seed crystal into contact with a silicon melt to melt the tip end of the seed crystal, performing necking operation, and growing a silicon single crystal, wherein any one of the aforementioned silicon seed crystals of the present invention is used as the seed crystal.

In the above method of the present invention for producing a silicon single crystal wherein the single crystal is grown with performing the necking operation, for example, a tip end of a seed crystal having a sharp-pointed tip end shape or truncated sharp-pointed tip end shape is brought into contact with a silicon melt and melted down therein to a predetermined position, then the necking operation is performed to eliminate dislocations, a cone portion is formed, and then a silicon single crystal is grown in an intended diameter. In the aforementioned method of the present invention, because the heat capacity of the seed crystal is small, dislocations are less likely to be generated. In addition, because of the low oxygen concentration in the seed crystal, i.e, 15 ppma or less, or 16 ppma or less as for the seed crystal not having a straight body, oxygen does not precipitate during the melting down of the seed crystal, and substantially no dislocation containing precipitated oxygen as a nucleus is generated. Therefore, dislocation-free production becomes possible even when a relatively large diameter of the neck portion is used. Accordingly, the rate of success in making crystals dislocation-free is improved, and thereby productivity and production yield of dislocation-free silicon single crystals are improved.

In this case, the shape of the seed crystal should not necessarily be in a shape having a sharp-pointed tip end, and the rate of success in making crystals dislocation-free can be improved by using a seed crystal having a low oxygen content as defined in the present invention even if a conventional seed crystal having a flat bottom face is used.

The present invention further provides a method for producing a silicon single crystal by the Czochralski method comprising bringing a tip end of a seed crystal into contact with a silicon melt to melt the tip end of the seed crystal, and growing a silicon single crystal without performing necking operation, wherein any one of the aforementioned silicon seed crystals of the present invention is used as the seed crystal.

In the aforementioned method of the present invention for producing a silicon single crystal wherein the single crystal is grown without performing necking operation, for example, a tip end of a seed crystal having a sharp-pointed tip end shape or truncated sharp-pointed tip end shape is brought into contact with a silicon melt and melted down therein to a predetermined position, then immediately a cone portion is formed without performing necking operation, and a silicon single crystal is grown in an intended diameter. In the aforementioned method of the present invention, because the heat capacity of the seed crystal is small, dislocations are less likely to be generated. In addition, because of the low oxygen concentration in the seed crystal, i.e, 15 ppma or less, or 16 ppma or less as for the seed crystal not having a straight body, oxygen does not precipitate during the melting down of the seed crystal, and substantially no dislocation containing precipitated oxygen as a nucleus is generated. Therefore, the rate of success in making crystals dislocation-free is improved, and growing of silicon single crystals having a larger diameter and heavier weight becomes possible.

According to the present invention, the rate of success in making crystals dislocation-free can be improved when silicon single crystal ingots are pulled by the Czochralski method regardless of use or unuse of the necking operation. This effect can be obtained with good reproducibility, and stably obtained for a long period of time. Therefore, the present invention can cope sufficiently with future use of a larger diameter, longer length, and heavier weight of single crystals, and can markedly improve the productivity and the production yield, and markedly reduce the production cost.

DESCRIPTION OF THE INVENTION AND EMBODIMENTS

Figure 1:
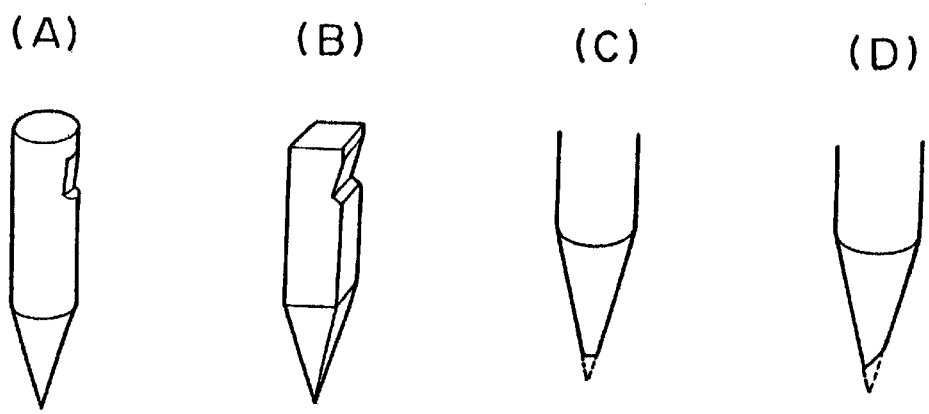
FIG. 1 shows perspective views of exemplary seed crystals having a straight body according to the present invention: (A); seed crystal in cone shape, (B); seed crystal in pyramid shape, (C); seed crystal in cone shape whose sharp-pointed tip end is horizontally truncated, (D); seed crystal in cone shape whose sharp-pointed tip end is slantingly truncated.

The present invention and embodiments thereof will be explained hereinafter, but the scope of the present invention is not limited to them.

In the methods for growing silicon single crystal ingots by the thick necking method with performing necking operation or by the dislocation-free seeding method without performing necking operation, the rate of success in making crystals dislocation-free may not reach a sufficient level. The inventors of the present invention investigated the cause of this phenomenon, and found that the oxygen concentration in the seed crystal and the shape of the seed crystal are closely related to the cause of the generation of dislocations. The inventors conducted detailed study about the requirements of these factors, and has accomplished the present invention.

First, influence of oxygen concentration in seed crystals on the conventional dislocation-free seeding method without performing necking operation was investigated, and various experiments were performed. As a result, the following requirements for dislocation-free production were established.

(Test 1)

First, seven kinds of seed crystal test pieces having different oxygen concentrations were prepared [oxygen concentration: <1, 5, 10, 15, 17, 20, and 25 ppma (JEIDA)]. The seed crystal having an oxygen concentration of less than 1 ppma was cut out from a single crystal ingot of low oxygen concentration produced by the FZ method. Those of 5–25 ppma were obtained from single crystal ingots produced by the CZ method. Each tip end of the silicon single crystal bars having different oxygen concentrations and 15 mm square cross-section was taper-processed into a cone shape having a vertical angle of 18°, and the surface was etched with a mixture of hydrofluoric acid and nitric acid by about 400 μm. By using those test pieces, single crystal ingots having a diameter of 150 mm were grown to investigate the rate of success in making crystals dislocation-free.

Single crystals were grown by the dislocation-free seeding method without performing necking operation where the seeding was performed with the aforementioned seed crystals. First, each seed crystal was temperature-held (pre-heated) for 30 minutes at a position 5 mm above the surface of a silicon melt, and then melted down from the tip end to a position having a diameter of 7 mm at a melting down rate of 4 mm/min, and a single crystal was immediately pulled without performing necking operation at a single crystal growth rate of 0.5 mm/min.

The rate of success in making crystals dislocation-free determined in the growth of the single crystal ingots prepared in Test 1 as described above is shown in FIG. 2. The rate of success in making crystals dislocation-free (%) [also referred to as "DF rate"] was represented as a percentage of number of dislocation-free single crystals relative to the total number of pulled single crystals in the test. The total number of the pulled single crystals for each experiment was 20 in this test.

Figure 2:
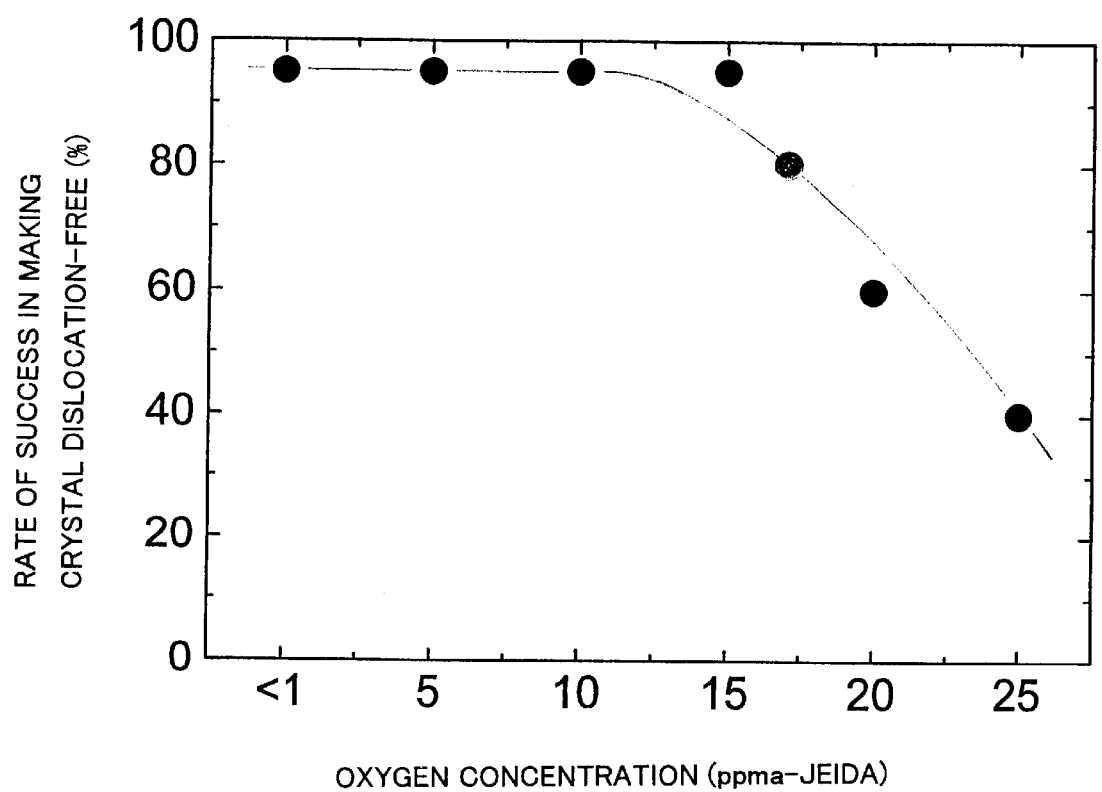
FIG. 2 shows a graph representing relationship between oxygen concentration in seed crystal and rate of success in making crystals dislocation-free in growing of single crystals without performing necking operation of Test 1.

As seen from the results of FIG. 2, whilst the rate of success in making crystals dislocation-free was as high as 95% to an oxygen concentration in the seed crystal of 15 ppma, it sharply fell in the range of oxygen concentration of 20 ppma or more. When the seed crystals after the crystal growth were examined, oxide precipitates were observed in the seed crystals of oxygen concentration of 20 ppma or more. In the seed crystals of oxygen concentration of 15 ppma or less, oxide precipitates were not observed. It was considered that the oxide precipitates were formed by precipitation of oxygen in the seed crystals under the temperature environment during the temperature holding of the seed crystals above the melt surface and the melting down process after the single crystals were attached to the holder in the furnace of the pulling apparatus. It was also considered that, because of the oxygen precipitation, the slip dislocations containing the precipitated portions as nuclei became likely to be generated during the melting down process of the seed crystals.

(Test 2)

Then, six kinds of seed crystals having different oxygen concentrations were prepared, and single crystals were grown by the seeding method with performing necking operation.

Each tip end of the silicon single crystal bars having 15 mm square cross-section was taper-processed into a cone shape having a vertical angle of 18°, and the surface was etched with a mixture of hydrofluoric acid and nitric acid by about 400 μm. First, each seed crystal was temperature-held (pre-heated) for 30 minutes at 5 mm above the surface of a silicon melt, and then melted down from the tip end to a position having a diameter of 7 mm at a melting down rate of 4 mm/min, then the necking operation was performed, and a single crystal ingot having a diameter of 150 mm was grown at a single crystal growth rate of 1.0 mm/min to investigate the rate of success in making crystals dislocation-free. The necking operation was performed with different conditions so that two levels of the diameter of the neck portion, 4 mm and 6 mm, were obtained. The rates of success in making crystals dislocation-free of the single crystal ingots prepared in this test are shown in Table 1.

TABLE 1

| | Item | | | |
|---|---|---|---|---|
| Experiment No. | Oxygen concentration in seed crystal (ppma-JEIDA) | Density of generated dislocations in seeding portion (×10$^4$/cm$^2$) | Diameter of neck portion (mm φ) | Dislocation-free rate [DF rate] (%) |
| 1a | <1 | 2.2 | 4 | 90 |
| 1b | <1 | 2.2 | 6 | 70 |
| 2a | 4 | 1.6 | 4 | 90 |
| 2b | 4 | 1.6 | 6 | 80 |
| 3a | 8 | 1.5 | 4 | 100 |
| 3b | 8 | 1.5 | 6 | 90 |
| 4a | 12 | 1.5 | 4 | 100 |
| 4b | 12 | 1.5 | 6 | 80 |
| 5a | 16 | 4.1 | 4 | 80 |
| 5b | 16 | 4.1 | 6 | 30 |
| 6a | 20 | 4.2 | 4 | 80 |
| 6b | 20 | 4.2 | 6 | 20 |

(Test 3)

Silicon prismatic seed crystals having 15 mm square cross-section, length of 80 mm, and flat face tip end were prepared from seven kinds of crystals as in Test 1 [oxygen concentration: <1, 5, 10, 15, 17, 20, and 25 ppma (JEIDA)].

First, each of the aforementioned seed crystal was temperature-held for 30 minutes at 5 mm above the surface of a silicon melt, then its tip end was immersed into the melt, and melted down in a length of about 2 mm. Then, the necking operation was performed to grow a single crystal. The diameter of the neck portion was 6 mm, and the single crystal growth rate was 1.0 mm/min. Twenty crystals were examined for each of the oxygen concentration levels of the seed crystal. The rates of success in making crystals dislocation-free observed in the production of the single crystal ingots prepared in this test are shown in Table 2.

TABLE 2

| | | Item | | | |
|---|---|---|---|---|---|
| Exper-Iment No. | Shape of seed crystal | Oxygen concentration in seed crystal (ppma-JEIDA) | Diameter of neck portion (mm) | Necking | Success rate of Dislo-cation-free (%) |
| 1 | Prism | <1 | 6 | Used | 80 |
| 2 | Prism | 5 | 6 | Used | 80 |
| 3 | Prism | 10 | 6 | Used | 85 |
| 4 | Prism | 15 | 6 | Used | 80 |
| 5 | Prism | 17 | 6 | Used | 70 |
| 6 | Prism | 20 | 6 | Used | 65 |
| 7 | Prism | 25 | 6 | Used | 35 |

From the experimental results of these Test 2 and Test 3, the following relationships between the oxygen concentration in seed crystals and the diameter of the neck portion, and the density of dislocation generation in the neck portion and the rate of success in making crystals dislocation-free have been revealed.

[1] Oxygen present in the oxygen concentration range in seed crystal of not more than 15 ppma acts to prevent the generation of slip dislocations due to thermal shock upon contact with the melt, but at a concentration exceeding 15 ppma, oxygen becomes to be precipitated because of too much amount of the oxygen, and those oxide precipitates themselves become a cause of the generation of slip dislocations.

[2] If the generation of slip dislocations during the seeding is not so significant, a relatively high DF rate can be obtained, even if a large diameter of neck portion, e.g., 6 mm, is used, and a sufficiently practical level of the DF rate for the production of crystals having a larger diameter and heavier weight is ensured.

As explained above, the oxygen concentration in seed crystals closely relates to the rate of success in making crystals dislocation-free, and if it is controlled to be within the appropriate range defined above, substantially no dislocation is generated in the crystals, and a high rate of success in making crystals dislocation-free can be maintained with good reproducibility. Further, it is particularly beneficial for growing of single crystals of a large diameter, and hence productivity, production yield, cost, and quality can be improved by controlling the oxygen concentration.

The seed crystal used for the seeding method with performing necking operation or the dislocation-free seeding method without performing necking operation of the present invention preferably has any one of conventionally used shapes, such as those shown in FIG. 1(A), (B), (C), and (D), where the tip end to be brought into contact with the melt has a sharp-pointed or truncated sharp-pointed cone or pyramid shape, and the straight body has a cylindrical or prismatic shape. However, the seed crystal having a sharp-pointed tip end referred to in the present invention is not limited to these.

The thickness of the straight body of the seed crystal is not particularly limited. However, the straight body preferably has a diameter not less than 14 mm as for cylindrical straight bodies, or a cross-section of 14 mm square or larger as for square pole straight bodies, or a diameter of inscribed circle of cross-section not less than 14 mm as for prismatic straight bodies having a polygonal cross-section. If the straight body has such a size, a sufficient tapered neck portion is formed between the seed crystal and the neck portion even when the neck portion is formed in a diameter of 4 mm or more, which surely eliminates the slip dislocations, and simultaneously provides a sufficient mechanical strength of the seed crystal itself. Thus, it would be sufficient for use in the production of larger and heavier single crystals.

The vertical angle of the aforementioned seed crystal is preferably 28° or less, and such an angle attenuates the thermal stress during the seeding, and thus it remarkably reduces or completely eliminates the generation of slip dislocations. Also during the melting down process, increase of slip dislocations is surely suppressed by the gradual change in the diameter.

Further, through various investigations, studies, and experiments about the shape of seed crystal, referring to the shapes conventionally used or previously disclosed as inventions, the following conditions for dislocation-free production including those for related factors other than the shape have been established.

(Test 4)

Figure 3:
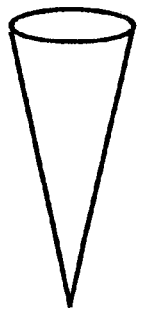
FIG. 3 shows perspective views of exemplary seed crystals not having a straight body according to the present invention: (a); cone shape, (b); pyramid shape, (c); cone shape whose side face is formed with curved surface.
Figure 3:
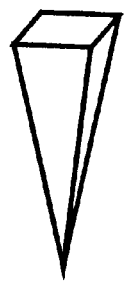
Figure 3:
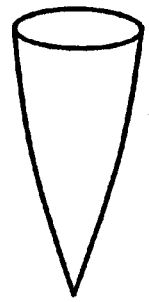
Figure 4:
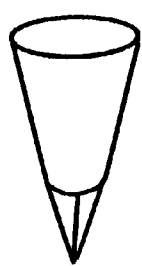
FIG. 4 shows perspective views of exemplary seed crystals not having a straight body according to the present invention: (a); combination of truncated cone and pyramid shapes, (b); combination of truncated pyramid and cone shapes.
Figure 4:
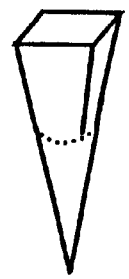

The seed crystals shown in FIG. 3 for exemplifying the shape of the seed crystal of the present invention have a cone shape (a), pyramid shape (b), or cone shape whose entire side surface is formed with curved surface (c), those shown in FIG. 4 have a shape consisting of a combination of pyramid shape and truncated cone shape (a), or combination of cone shape and truncated pyramid shape (b), and all of them do not have a straight body.

The investigated factors are shape of the seed crystal (A), oxygen concentration contained in the seed crystal (B), diameter of seed crystal after the melting down process (C), diameter of the neck portion (D), use or nonuse of the necking operation (E), as shown in Table 3.

Figure 5:
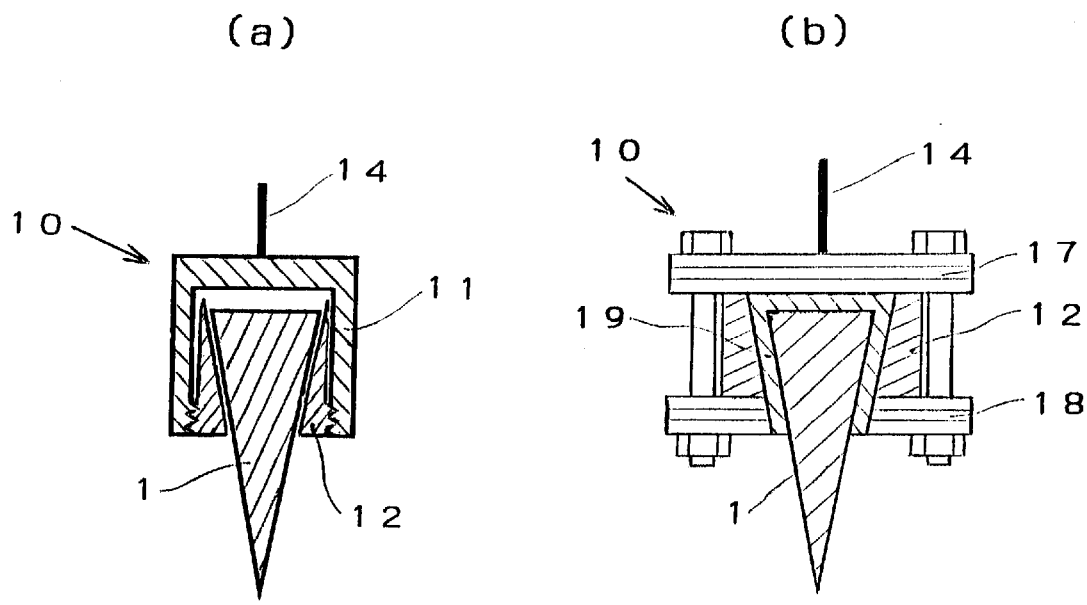
FIG. 5 shows vertical cross-sectional views of exemplary seed crystal holders of the present invention, which are set with seed crystals not having a straight body according to the present invention: (a) seed crystal holder having a cap nut and ring structure, (b) seed crystal holder where a heat insulating material is inserted.
Figure 6:
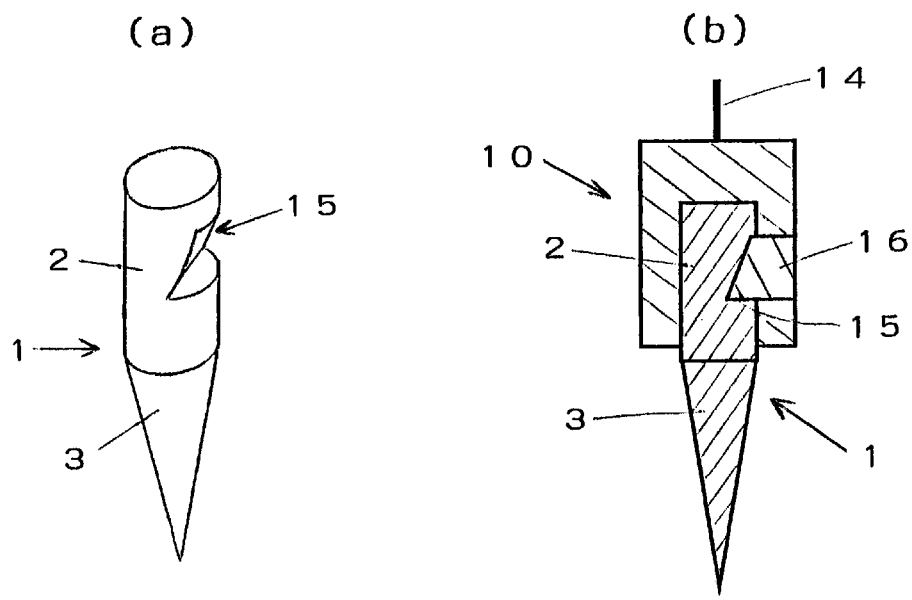
FIG. 6 shows explanatory views representing a conventional seed crystal having a straight body, and a seed crystal holder set with it: (a) perspective view representing shape of seed crystal, (b) vertical cross-sectional view representing a seed crystal holder set with a seed crystal.

As for the shape of the silicon seed crystal 1, seed crystals were prepared with or without a straight body. Those not having a straight body were taper-processed into a cone shape having a bottom face diameter of 20 mm, length of 80 mm, and a vertical angle of 14° as shown in FIG. 3(a), surface-etched with a mixed acid by about 400 μm, and set on a seed crystal holder 10 of the present invention as shown in FIG. 5. Those having a straight body consisted of a straight body having a diameter of 20 mm×length of 40 mm and a cone portion having a bottom face diameter of 20 mm, length of 80 mm, and a vertical angle of 14° as shown in FIG. 6(a), and set on a conventional seed crystal holder 10 by inserting the straight body 2 of the seed crystal 1 into a cylindrical body of the holder 10, and inserting a taper pin 16 into a notch 15 of the seed crystal 1 as shown in FIG. 6(b).

As for the seeding operation, the seeding method that does not perform the necking operation will be explained first. Each of the aforementioned seed crystals was temperature-held (pre-heated) for 5 minutes at a position 5 mm above a silicon melt, and then descended at a rate of 2.0 mm/min into the melt to melt down the tip end. A predetermined length of the seed crystal was inserted so that the tip end should be melted down to a position having a diameter (C) [this diameter should be not less than 1.1 times of the desired diameter (D) of the neck portion when the necking operation was performed], and then the seed crystal was immediately, slowly pulled upwardly without performing necking operation to increase the diameter, and a single crystal ingot having a diameter of 150 mm (6 inches) was grown at a predetermined single crystal growth rate for investigation of the rate of success in making crystals dislocation-free.

As for the seeding method which performs the necking operation, each of the aforementioned silicon seed crystals was temperature-held (pre-heated) for 5 minutes at a position 5 mm above a silicon melt, and then descended at a rate of 2.0 mm/min into the melt to melt down the tip end. A predetermined length of the seed crystal was inserted so that the tip end should be melted down to a position having a diameter (C) at the tip end of the seed crystal, which was not less than 1.1 times of the desired diameter (D) of the neck portion, then the necking operation was performed to form a neck portion of an inverted cone shape until the diameter reached the desired diameter (D), the necking operation was continued while maintaining the diameter to form a neck portion having a predetermined length, and the diameter was increased to grow a single crystal ingot having a diameter of 150 mm (6 inches) at a predetermined single crystal growth rate for investigation of the rate of success in making crystals dislocation-free.

The rates of success in making crystals dislocation-free in the silicon single crystals prepared as described above are shown in Table 3. The total number of the pulled single crystals for each experiment was 20 in this test.

the tip end of the seed crystal is brought into contact with the melt, melted down, and pulled. Therefore, dislocations become to be less likely to occur, or even if they are already generated, they become to be more likely to disappear. The improvement of the rate of temperature increase also contributes to shortening of the operation time, and therefore it can be expected to improve the productivity and the production yield.

[2] As for a seed crystal that does not have a straight body, an oxygen concentration in the seed crystal of 16 ppma (JEIDA) or less affords a high rate of success in making crystals dislocation-free (comparison between the experimental results of Experiment Nos. 3 and 4).

When the oxygen concentration in the seed crystal is suppressed as mentioned above, oxygen does not precipitate when the seed crystal is brought into contact with the melt and during its melting down therein, and substantially no slip dislocation containing the precipitated oxygen as a nucleus is generated. A seed crystal not having a straight body and having a sharp-pointed tip end can reduce the total heat capacity of the seed crystal and the seed crystal holder, and hence the seed crystal is maintained at a high tempera-

TABLE 3

| Ex. No. | Shape of seed crystal (A) | Oxygen concentration in seed crystal (B) (ppma-JEIDA) | Diameter of position where melting was finished (C) (mm) | Diameter of neck portion (D) (mm) | Use or nonuse of necking operation (E) | Success rate of dislocation [DF rate] (%) |
|---|---|---|---|---|---|---|
| 1 | Cone | 16.0 | 6.6 | 6.6[2] | Not used | 85 |
| 1' | Cone | 16.0 | 6.6 | 6.3 | Used | 90 |
| 2 | Cone | 16.0 | 6.6 | 6.0 | Used | 95 |
| 3 | Cone | 16.0 | 10.0 | 6.0 | Used | 100 |
| 4 | Cone | 18.0 | 10.0 | 6.0 | Used | 75 |
| 5 | Straight body[1] | 16.0 | 6.6 | 6.6[2] | Not used | 65 |
| 5' | Straight body[1] | 16.0 | 6.6 | 6.3 | Used | 70 |
| 6 | Straight body[1] | 16.0 | 6.6 | 6.0 | Used | 85 |
| 7 | Straight body[1] | 16.0 | 10.0 | 6.0 | Used | 90 |

Note: [1]Cone shape (bottom face diameter 20 mm φ × height 40 mm) having straight body (diameter 20 mm φ × height 40 mm);
[2]Diameter at position where diameter was started to be increased in dislocation-free seeding method without performing necking operation.

From the results shown in the above table, it was revealed that there are the following relationships between the factors (A)–(E) and the rate of success in making crystals dislocation-free.

[1] As for the shape of silicon seed crystal (A), the cone shape not having a straight body affords a higher rate of success in making crystals dislocation-free compared with the cone shape having a straight body (comparison between the experimental results of Experiment Nos. 1 and 5 [without neck portion], those of Experiment Nos. 2 and 6 [with neck portion], and those of Experiment Nos. 3 and 7 [with neck portion]).

This is because of the following reasons. The rate of temperature increase of a seed crystal of cone shape not having a straight body when the seed crystal is approached to the melt surface becomes higher, because it has a smaller heat capacity including that of the seed crystal holder. In addition, it can make the temperature gradient smaller while ture to a certain height from the liquidus-solidus interface, which makes oxygen precipitation difficult. This effect can be more effectively obtained when the initial oxygen concentration in the seed crystal is selected to be 16 ppma (JEIDA) or less.

[3] When the thick necking crystal seeding method with performing necking operation and the dislocation-free seeding method without performing necking operation are compared, the thick necking crystal seeding method with performing necking operation affords a higher rate of success in making crystals dislocation-free (comparison between the experimental results of Experiment Nos. 1 and 1', 2, 3 [cone-shaped seed crystals not having a straight body]).

This effect is considered to be obtained by the fact that, when the necking operation is performed after the melting down process to form a neck portion in an inverted cone shape, and then the neck portion is formed, substantially no slip dislocations are newly generated, or slip dislocations do not increased after the melting down process, and thereby the rate of success in making crystals dislocation-free can be further improved.

However, the rate of success in making crystals dislocation-free in Experiment No. 1, 85%, which was obtained by the dislocation-free seeding method without performing necking operation, is a level having sufficiently practical value.

Also in the dislocation-free seeding method without performing necking operation, the rate of success in making crystals dislocation-free was remarkably improved by using the seed crystal not having a straight body of the present invention, compared with the case where a conventional seed crystal having a straight body was used (comparison of the experimental results of Experiment Nos. 1 and 5, 65%→85%).

[4] Slip dislocations can be made difficult to be generated by performing necking operation. When the necking operation is performed, the diameter of the position where the melting down process is finished (melting down diameter) is preferably 1.1 times or more of the diameter intended in the neck portion (comparison of the results of Experiment Nos. 1', 2 and 3, and Experiment Nos. 5', 6 and 7). This is because it is effective for the dislocation-free production utilizing necking operation to form a tapered neck portion where the diameter is made gradually smaller in an early stage of the necking operation, in order to surely eliminate slip dislocations, even if dislocations are generated during the necking operation after the melting down process. It was confirmed by another experiment that slip dislocations cannot be decreased if a neck portion in a cylindrical shape having the same diameter as the melting down diameter is formed without forming a tapered neck portion.

As explained in detail hereinabove, in the thick necking seeding method where the necking operation is performed by using the seed crystal not having a straight body of the present invention, at least the factors including the oxygen concentration in seed crystal (B), melting down diameter of seed crystal tip end (C) and the like are closely related to the rate in success in making crystals dislocation-free. By controlling these factors in appropriate ranges, slip dislocations can be surely eliminated in the necking operation, and generation of slip dislocations in pulled crystals can be substantially suppressed, and thereby high rate of success in making crystals dislocation-free can be maintained with good reproducibility. In addition, such control can particularly contribute to growth of single crystals having a large diameter and weight. Therefore, improvement of the productivity and the production yield, and cost reduction can be expected.

Also in the dislocation-free seeding method without performing necking operation, by controlling the oxygen concentration in the seed crystal in an appropriate range, slip dislocations can be surely eliminated without performing the necking process, and generation of slip dislocations in pulled crystals can be substantially suppressed, and thereby high rate of success in making crystals dislocation-free can be maintained with good reproducibility. In addition, such control can particularly realize growth of single crystals having a large diameter and weight.

The seed crystal not having a straight body, which is used for the thick necking seeding method where the necking operation is performed, or the dislocation-free seeding method without performing necking operation, has a shape not having a straight body. Specifically, examples of the shape include cone, pyramid, truncated cone, truncated pyramid, combination of cone and truncated cone, combination of cone and truncated pyramid, combination of pyramid and truncated pyramid, combination of pyramid and truncated cone and the like, and the shape may be selected from these.

As the shape of the seed crystal not having a straight body, various shapes can be exemplified as mentioned above. As for the advantageous effects thereof, for example, a seed crystal having a cone shape is held on a part of its side face near its bottom face, or all of its side surface by a seed crystal holder, and therefore the load withstanding property of the seed crystal itself may be improved. Further, the absence of the straight body reduces the total volume and heat capacity of the seed crystal and the seed crystal holder, and accelerates the rate of temperature increase when the seed crystal is approached to the melt surface. Moreover, after the tip end of the seed crystal is brought into contact with the melt, it enables making the temperature gradient smaller during its melting down and pulling. Therefore, dislocations become less likely to be generated, and already generated dislocations become likely to disappear. It is clear that a seed crystal having one of the shapes mentioned above other than the cone shape can also exert substantially the same advantageous effects as those provided by the cone shape.

Further, a part or all of the side surface of the aforementioned seed crystals is preferably formed with curved surface.

For example, when a seed crystal which has a tapered cone-shaped tip end having a straight ridgeline is melted down from the tip end into a silicon melt at a constant rate, the melting interface diameter of the seed crystal becomes larger in proportion to the lapsed time. On the other hand, by using a silicon seed crystal a part or all of which side surface is formed with curved surface, increase rate of the diameter along the ridgeline can be made smaller compared with that provided by the straight ridgeline in the region of cone whose side surface is formed with curved surface, and therefore the thermal stress in a portion where the diameter of the melting interface is getting larger is greatly attenuated. Accordingly, the probability of slip dislocation generation is reduced, and the region where dislocations are more likely to be generated is shifted to the thicker side. The pulling can be started from a point in a dislocation-free state defined after such a regional shift. This improves the rate of success in making crystals dislocation-free, and sufficiently meets the requirements for growing single crystals having a larger diameter and heavier weight.

As a specific example of the curved surface, there can be mentioned a curved surface whose ridgeline satisfies the equation:

$$d^2r/dx^2<0$$

wherein r represents a maximum radius of the seed crystal at the melting interface, and x represents a position along the direction in which the melting interface moves during the melting down of the seed crystal, and a seed crystal processed to have such a curved surface is preferably used.

As also for the seed crystal not having a straight body, the vertical angle of the tip end tapered portion is preferably 28° or less as mentioned above, and such an angle attenuates the thermal stress during the seeding, and thus it eliminates the generation of slip dislocations. Also during the melting down process, generation of dislocations is surely suppressed by the gradual change in the thickness of the seed crystal such as cone, truncated cone, pyramid, and truncated pyramid shapes.

As the pyramid and the truncated pyramid, any of many-sided cones having side faces not less than those of triangular pyramid may be used.

As shown in FIG. 5(a), the seed crystal holder for holding the seed crystal of the present invention is constituted with, for example, a cap nut 11 which has a female thread on its inner surface, and an upper surface connected to a lifting wire 14 at its center, and accommodates the seed crystal 1, and a ring 12 which has an inner surface corresponding to the tapered portion or curved surface portion of the seed crystal 1 and a male thread formed on its outer surface, and supports the seed crystal 1.

FIG. 5(b) shows another example of the seed crystal holder, which has a structure that the ring 12 which has an inner surface corresponding to the tapered portion or curved surface portion of the seed crystal 1 is placed between a ring upper surface jig 17 whose upper surface is connected to the lifting wire 14 at its center, and a ring lower surface jig 18, and tightened with bolts and nuts or the like. In FIG. 5(b), a heat insulating material or heat-resistant cushioning material 19 is put between the surface of seed crystal 1 and the internal surface of the ring 12.

By using a seed crystal holder 10 having such a structure as mentioned above, substantially entire surface of the tapered portion or curved surface portion of the seed crystal 1 can be contacted and sufficiently fitted with the inner surface of the ring 12 of the holder by multiple-point or face contact. In addition, because it becomes unnecessary to provide grooves, holes, notches or the like on the seed crystal for fixing it to the seed crystal holder, the load withstanding property of the seed crystal itself is greatly improved. Thus, the structure copes sufficiently with the growing of single crystals having a larger diameter and heavier weight.

Further, because the seed crystal does not have a straight body, the seed crystal holder itself can be miniaturized. Together with the miniaturization of the seed crystal, this makes the total volume and heat capacity of the seed crystal and the holder smaller. Therefore, the rate of temperature increase of the seed crystal when the seed crystal is approached to the melt surface becomes higher, and the temperature gradient can be made smaller during the melting down process and the pulling process after the tip end of the seed crystal is brought into contact with the melt. Accordingly, dislocations become to be less likely to occur, or even if they are already generated, they become to be more likely to disappear. The improvement of the rate of temperature increase also contributes to shortening of the operation time, and therefore improvement of the productivity and the production yield can be expected.

Further, by putting a heat-resistant cushioning material such as carbon fiber felt and ceramic fiber felt between the surface of the seed crystal 1 and the internal surface of the ring 12 to provide face contact for the whole surface of contact, concentration of the high weight load of the growing single crystal on a particular point can be prevented.

Furthermore, by putting a heat insulating material such as foamed ceramics and ceramic fiber between the surface of the seed crystal 1 and the internal surface of the ring 12, the rate of temperature increase of the seed crystal when the seed crystal is approached to the melt surface can be made further higher, and the temperature gradient can be made further smaller during the melting down process and pulling operation after the tip end of the seed crystal is contacted with the melt surface. Accordingly, dislocations become to be less likely to occur, or even if they are already generated, they become to be more likely to disappear. The improvement of the rate of temperature increase also contributes to shortening of the operation time, and therefore improvement of the productivity and the production yield can be expected.

The present invention is not limited to the embodiments described above. The above-described embodiments are mere examples, and those having the substantially same characteristics as those described in the appended claims and providing the similar functions and advantages are included in the scope of the present invention.

For example, while the above-mentioned embodiments concern growing of silicon single crystals having a diameter of 150 mm (6 inches), the present invention is applicable to, for example, growing of silicon single crystals having a larger diameter such as 200 mm (8 inches) to 400 mm (16 inches) or more as recently used.

The present invention can of course be applied not only to the ordinary Czochralski method but also to the MCZ method (Magnetic Field Applied Czochralski Crystal Growth Method) in which a magnetic field is applied when a silicon single crystal is pulled. The term "Czochralski method" used in the present specification includes not only the ordinary Czochralski method but also the MCZ method.

As for the shape of the seed crystal of the present invention, while those having a sharp-pointed tip end has been mainly explained hereinabove, the present invention is not limited to these. The present invention is also applicable to conventional seed crystals having a flat tip end, because the generation of slip dislocations is similarly prevented by using a low oxygen concentration.

What is claimed is:

1. A silicon seed crystal which is composed of silicon single crystal and used for the Czochralski method, wherein oxygen concentration in the seed crystal is 12 ppma (JEIDA) or less.

2. The silicon seed crystal according to claim 1, wherein the silicon seed crystal has a shape having a sharp-pointed tip end, or a truncated sharp-pointed tip end.

3. A silicon seed crystal which is used for the Czochralski method, wherein the silicon seed crystal does not have a straight body portion, but has a body shape selected from the group consisting of a cone shape, a pyramid shape, a cone shape whose side face is formed with a curved surface, a combined truncated cone and pyramid shape, and a combined truncated pyramid and cone shape.

4. The silicon seed crystal according to claim 3, wherein a part or all of a side surface of the seed crystal is formed with a curved surface.

5. The silicon seed crystal according to claim 3, wherein oxygen concentration in the seed crystal is 16 ppma (JEIDA) or less.

6. The silicon seed crystal according to claim 4, wherein oxygen concentration in the seed crystal is 16 ppma (JEIDA) or less.

* * * * *